United States Patent
Feger et al.

[11] Patent Number: 5,490,151
[45] Date of Patent: Feb. 6, 1996

[54] BOUNDARY SCAN CELL

[75] Inventors: William E. Feger, Macungie, Pa.; Paul W. Rutkowski, Morris Plains, N.J.

[73] Assignee: AT&T Corp., Murray Hill, N.J.

[21] Appl. No.: 96,286

[22] Filed: Jul. 26, 1993

[51] Int. Cl.[6] .................................................. G01R 31/28
[52] U.S. Cl. ................................................... 371/22.3
[58] Field of Search ................................ 371/22.3, 22.4, 371/22.5, 22.6, 37

[56] References Cited

U.S. PATENT DOCUMENTS

| | | | |
|---|---|---|---|
| 5,084,874 | 1/1992 | Whetsel, Jr. | 371/22.3 |
| 5,155,732 | 10/1992 | Jarwala et al. | 371/22.3 |
| 5,349,587 | 9/1994 | Nadeau-Dostie et al. | 371/22.3 |

OTHER PUBLICATIONS

*IEEE Standard Test Access Port and Boundary–Scan Architecture,* IEEE Std. 1149.1–1990, Ch 1, "Introduction," pp. 1-1–1.5, and Ch 10, The Boundary–Scan Register, pp. 10-1–10.28.

*Primary Examiner*—Vincent P. Canney
*Attorney, Agent, or Firm*—Robert B. Levy

[57] ABSTRACT

A Boundary-Scan cell (12') for facilitating testing of an electronic device (10), includes a system flip-flop (30') interposed between an output buffer (18) of the device and an internal logic block (14) which drives the buffer. The system flip-flop has asynchronous clear and preset capability which allows the flip-flop to be cleared or preset as necessary so that its output bit reflects a bit previously latched in the Boundary-Scan cell during testing. During non-testing intervals, the preset and clear capability of the system flip-flop (30') is disabled to allow the flip-flop to pass a bit between the internal logic of the device and the output buffer without undue propagation delays.

5 Claims, 2 Drawing Sheets

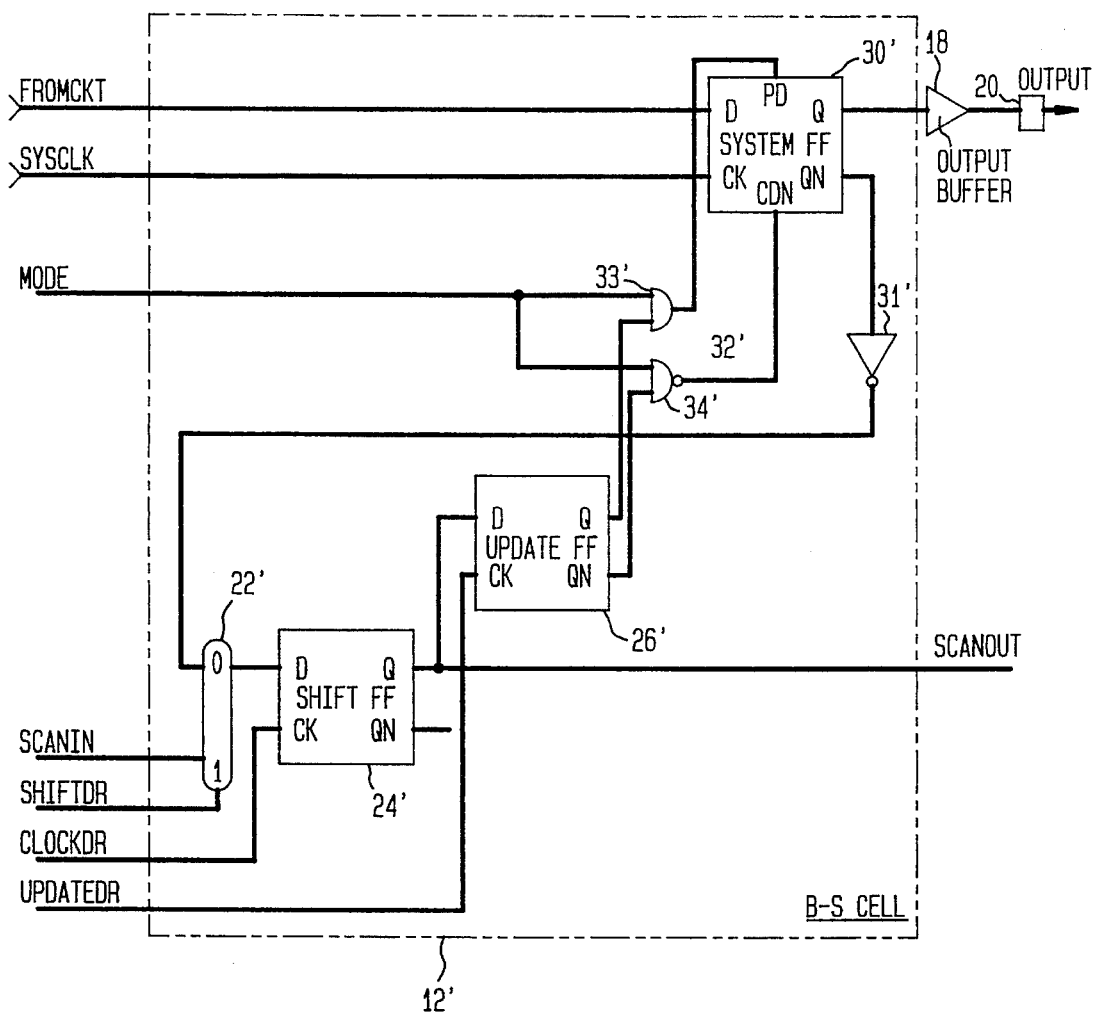
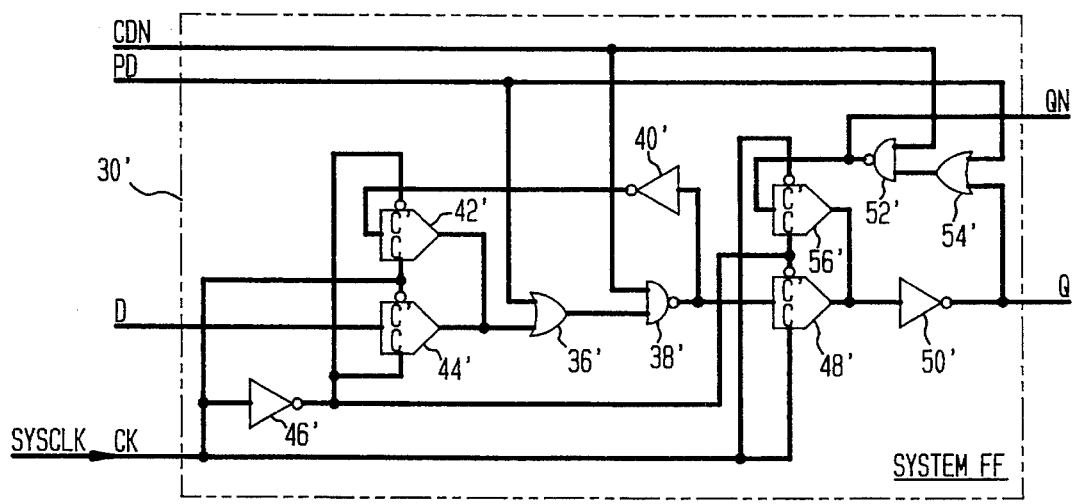

BOUNDARY SCAN CELL

TECHNICAL FIELD

This invention relates to a circuit for enabling Boundary-Scan testing of an electronic device in the manner prescribed by the ANSI/IEEE 1149.1 Standard on Boundary-Scan during a testing mode, and for enabling the device to operate with reduced propagation delays during non-testing intervals.

BACKGROUND OF THE INVENTION

To facilitate the testing of a digital electronic device, such as an integrated circuit, or a circuit board containing a plurality of integrated circuits or even a group of boards, a testing technique known as Boundary-Scan has been developed. The Boundary-Scan test technique, which is now embodied in the ANSI/IEEE 1149.1 Standard on Boundary-Scan, is practiced by providing a Boundary-Scan cell, typically a single-bit shift register, at each output node (e.g., pin) of the electronic device which is coupled to an input node of another device. The Boundary-Scan cell is interposed between the output node and an internal logic block which drives the node, respectively. Each Boundary-Scan cell associated with each separate node is coupled in series with each of the other cells in a single chain (referred to as a Boundary-Scan chain) such that the output of each preceding cell is supplied to an input of the next succeeding cell in the chain.

Actual testing in accordance with the Boundary-Scan test technique is accomplished by shifting a known string of bits through the chain of Boundary-Scan cells so that each bit in the string is latched into a separate cell. For each Boundary-Scan cell coupled to an output node, the cell is "updated," i.e., the bit previously shifted into the cell now appears at the output node associated with the cell. As a consequence, a Boundary-Scan cell associated with an input node will "capture" (i.e., be supplied with) the bit appearing at an output node of another device which drives this input node. Thus, when each output node is "updated," the logic value presented to the Boundary Scan cell associated with the input node driven by the updated output node will likely change.

Once each Boundary-Scan cell associated with an input node has captured the bit appearing at the output node driving the input node, then the string of bits held by the chain of Boundary-Scan cells is shifted out. A comparison is then made between the string of shifted-out bits and a reference bit string representing the bits that would be obtained when the inter-device connections (i.e., the connections between the output and the input nodes of the devices) are fault-free. Any differences between the shifted-out bit string and the reference bit string are indicative of an error. For a more detailed description of the Boundary-Scan test technique embodied in the ANSI/IEEE Standard 1149.1, reference should be had to the publication IEEE Standard Test Access Port and Boundary-Scan Architecture, published by the Institute of Electrical and Electronics Engineers, New York, New York (1990), herein incorporated by reference.

As mentioned, when a Boundary-Scan cell is associated with an output node, the cell is interposed between the node and the internal logic of the device which drives the node. To allow either the Boundary-Scan cell or the internal logic of the device to separately drive the output node, a multiplexer is provided within the Boundary-Scan cell to multiplex signals from the cell and the internal logic of the device. Unfortunately, the multiplexer will impart a propagation delay to signals passing between the internal logic of the device and the corresponding output node during non-testing intervals. Such a propagation delay is undesirable, especially if the electronic device is to operate at high speeds. For this reason, high-speed electronic devices heretofore have not been provided with Boundary-Scan cells, thereby precluding the ability to test inter-device connections by the Boundary-Scan test technique described above.

Thus, there is a need for a Boundary-Scan cell which affords reduced propagation delays to enable such a Boundary-Scan cell to be employed in a high speed electronic device to facilitate Boundary-Scan testing.

SUMMARY OF THE INVENTION

Briefly, there is provided a Boundary-Scan cell, interposed between an internal logic block of an electronic device, and a device node. The Boundary-Scan cell is connected in series with each of a plurality of other Boundary-Scan cells associated with other electronic devices to facilitate Boundary-Scan testing. Within the Boundary-Scan cell there is provided a shift flip-flop for holding a single bit. A shift multiplexer supplies the shift flip-flop with the output bit of another Boundary-Scan cell in the chain during testing intervals, or supplies the shift flip-flop with a bit indicative of the bit to pass between the corresponding internal logic block in the electronic device and the device node. An update flip-flop is coupled to the shift flip-flop for storing the bit held by the shift flip-flop. A system flip-flop is present for passing a bit between the internal logic block of the electronic device and the corresponding device node during non-testing intervals, and alternatively, for supplying a bit, which is representative of the bit stored in the update flip-flop, to the device node during the testing mode. Additionally, the system flip-flop also feeds the shift multiplexer so that a bit, indicative of the state of the bit to pass between the internal logic block of the device and the device node during non-testing intervals, can pass to the shift-flip-flop.

In accordance with the invention, the system flip-flop is configured to have preset and clear capability. Additionally, a logic circuit is coupled between the update flip-flop and the system flip-flop. The logic circuit is responsive to both the bit stored in the update flip-flop and to an external, single-bit MODE signal whose state is indicative of whether the electronic device is to operate in a test mode or in a normal (i.e., non-test) fashion. The logic circuit operates to preset and clear the system flip-flop so that during testing intervals, the system flip is preset or cleared in accordance with the bit held by the update flip-flop. During non-testing intervals, the preset and clear functions of the system flip-flop are disabled to allow the system flip-flop to operate as a conventional flip-flop and pass a bit between the internal logic block of the device and the device node.

While the Boundary-Scan cell of the invention is most useful as a "output" cell (i.e., a cell interposed between the internal logic of the device and an output node), the cell can also be used as a "control" Boundary-Scan cell interposed between the internal logic of the device and a device node which receives a control signal. Further, the Boundary-Scan cell of the invention can be used as a "bidirectional" as well as an "input" Boundary-Scan cell so as to be interposed between the internal logic of the device and an input/output and an input pin, respectively.

BRIEF DESCRIPTION OF THE DRAWING

FIG. 2 is a block schematic diagram of a preferred embodiment of a Boundary-Scan cell of the invention; and FIG. 3 is a block diagram of a system flip-flop in the Boundary-Scan cell of FIG. 2.

DETAILED DESCRIPTION

Figure 1:
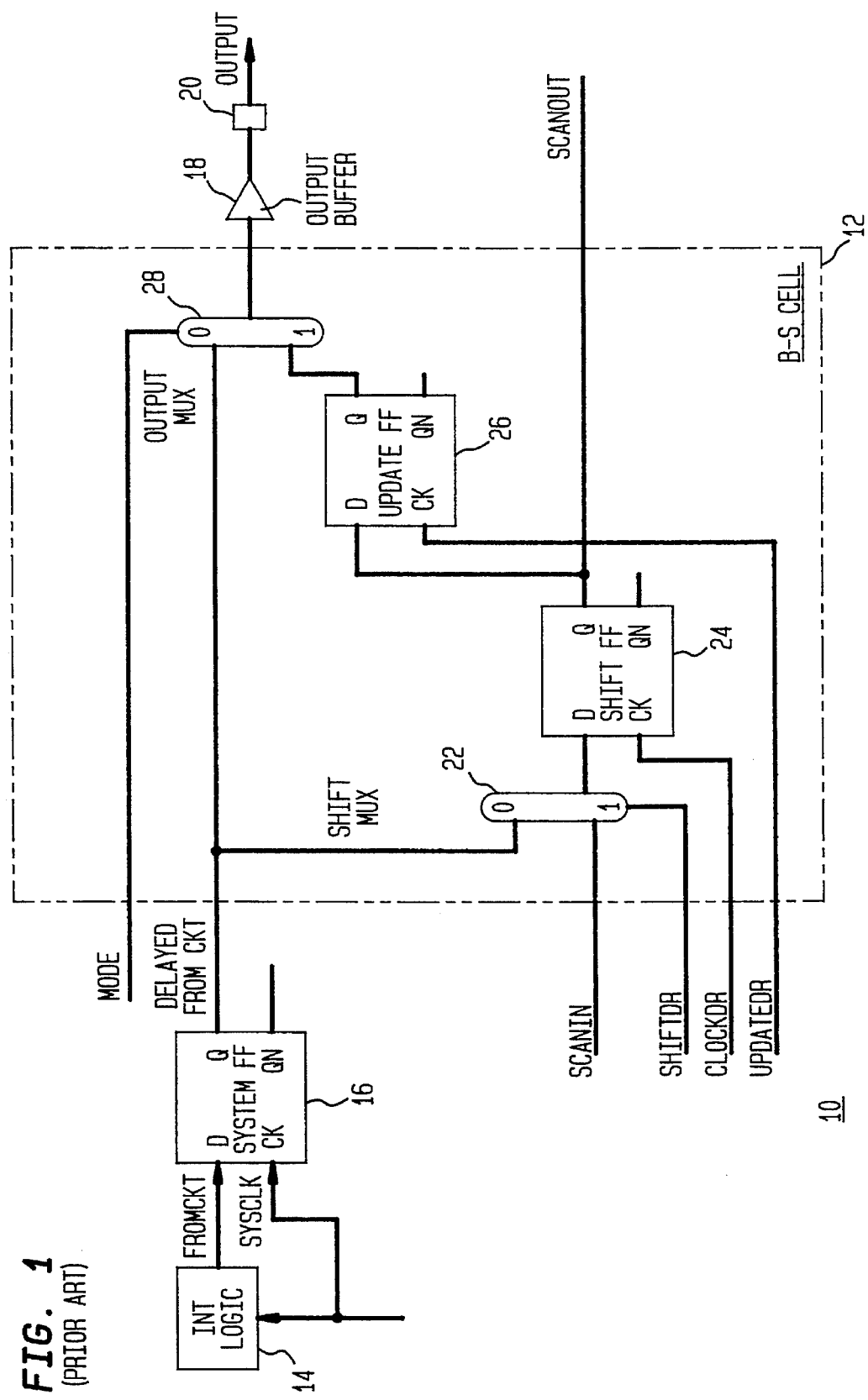
FIG. 1 is a block schematic diagram of a Boundary-Scan cell according to the prior art.

To best understand the structure and operation of the Boundary-Scan cell of the present invention, reference should first be had to FIG. 1, which shows a portion of a digital electronic device 10 that incorporates at least one, and preferably, a plurality of conventional (prior art) Boundary-Scan cells 12 (only one shown) for facilitating testing the connections between the device 10 and one or more other devices in accordance with the Boundary-Scan test technique. The electronic device 10 may be comprised of a single integrated circuit, a group of circuits coupled together on a single circuit board, or even a group of circuit boards. For purposes of discussion, the device 10 typically includes at least one, and preferably, a plurality of internal logic blocks 14 (only one shown), which having an associated Boundary-Scan cell 12. To simplify discussion, only the Boundary-Scan 12 associated with an output node will be described.

The structure of each logic block 14 in the device 10 depends on the function(s) to be performed by the device. The exact details of each logic block 14 are not relevant to the Boundary-Scan cell 12, other than from the standpoint that each logic block generates a single bit output signal, hereinafter designated as FROMCKT. For high-speed operation, the output signal FROMCKT produced by each logic block 14 is passed to the corresponding "output" Boundary-Scan cell 12 via a system flop-flop 16, the output signal of the flip-flop being referred to as "delayed FROMCKT." Typically, the system flip-flop 16 is clocked synchronously with the logic block by a common clock signal SYSCLK. For purposes of discussion, the system flip-flop 16 has been shown separately from the internal logic block 14. In reality, the system flip-flop 16 actually comprises an integral part of the internal logic block.

The output signal of the system flip-flop 16 (i.e., the delayed FROMCKT signal) is supplied to the Boundary-Scan cell 12 for passage therethrough, during normal operation of the device 10 (i.e., non-Boundary-Scan testing), to an output buffer 18. The buffer 18, in turn, drives an output node 20.

As will become better understood hereinafter, the Boundary-Scan cell 12 is designed to be serially coupled with each of a plurality of other Boundary-Scan cells, each configured generally in the manner set forth in the aforementioned publication IEEE Standard Test Access Port and Boundary-Scan Architecture, incorporated by reference herein. The result is a single chain of cells for Boundary-Scan testing of the interconnections of the device 10 to one or more devices. To this end, the Boundary-Scan cell 12 includes a shift multiplexer 22 that is supplied at its first (i.e., "0") input with the output of the system flip-flop 16. The shift multiplexer 22 has a second (i.e., "1") input supplied with a single-bit input signal ScanIN which is received from an upstream Boundary-Scan cell (not shown) in the chain. The multiplexer 22 is controlled by a signal ShiftDR and, depending on that state of that signal, the multiplexer passes a separate one of the signals at its first and second inputs to a shift flip-flop 24 for receipt at its D input. As may be appreciated, depending on the state of the ShiftDR signal, the shift flip-flop 24 stores either the output bit of the system flip-flop 16, which indicates the state of the delayed FROMCKT signal, or stores the input bit ScanIN generated by the upstream Boundary-Scan cell in the chain.

The shift flip-flop 24 is clocked by a clock signal ClockDR and, in response, the flip-flop generates a signal at its Q output indicative of the bit latched therein. The Q output signal of the shift flip-flop 24 is designated as the "ScanOUT" signal of the Boundary-Scan cell and forms a ScanIN signal supplied to a downstream Boundary-Scan cell (not shown). During Boundary-Scan testing of the device 10, a known string of bits is shifted through the chain of Boundary-Scan cells 12 by shifting the bits through each shift register 24 of each Boundary-Scan cell in the chain.

The signal at the Q output of the shift flip-flop 24 is also supplied to an update flip-flop 26 for receipt at its D input. When one of the bits of the string shifted through the shift flip-flop 24 is to be held by the Boundary-Scan cell 12, the update flip-flop 25 is clocked by a clock signal Update DR applied to its clock input CK to latch the bit from the shift register. The update flip-flop 25 has its Q output coupled to one input (designated as the "1" input) of a multiplexer 28, referred to as the output multiplexer because its output is supplied to the output buffer 18. The output multiplexer 28 has its other input (designated the "0" input) supplied with the Q output of the system flip-flop 16.

The multiplexer 28 passes the signal at one of its "0" and "1" inputs in accordance with the state of a single-bit signal (referred to as the "MODE" signal) applied to the multiplexer at its control input. When the MODE signal is at a first logic value (i.e., a logic "0"), designating a normal operating state for the device 10, the output multiplexer 28 passes the delayed FROMCKT signal at the output of the system flip-flop 16 to the output buffer 18. Conversely, when the MODE signal is at a second logic level (i.e., a logic "1"), indicating that the device 10 is now in a test mode, the output multiplexer 28 passes the signal from the update flip-flop 26 to the output buffer 18.

The prior art Boundary-Scan cell 12 thus described incurs the disadvantage that the single-bit signal (i.e., the delayed FROMCKT signal), passing from the system flip-flop 16 to the output buffer 18 during normal (i.e., non-testing mode) operation of the device 10, experiences a propagation delay during passage through the output multiplexer 28. The propagation delay is normally measured in terms of the number of gates the bit must traverse. In the case of the output multiplexer 28, there are two internal gates (not shown) in the multiplexer through which the signal must pass before reaching the output buffer 18. Thus, the output multiplexer 28 is said to incur a two-gate delay. Such a delay is disadvantageous when the device 10 is to operate at high speeds.

Referring now to FIG. 2, there is shown a block schematic diagram of a Boundary-Scan cell 12', in accordance with the invention, which facilitates Boundary-Scan testing of connections of the device 10 to other such devices, yet affords a reduced propagation delay during normal (non-test mode) operation. For ease of discussion, the same reference numbers, each followed by a prime ('), have been used in FIG. 2 to describe the corresponding elements in FIG. 1. Like the Boundary-Scan cell 12 of FIG. 1, the Boundary-Scan cell 12' of FIG. 2 includes a shift multiplexer 22' having a first (i.e., "0") input, and a second (i.e., "1") input, the latter being supplied with the signal ScanIN from an up-stream Boundary-Scan cell (not shown). The input multiplexer 22' is identical in function to the input multiplexer 22 of FIG. 1 and is thus responsive to the control signal ShiftDR. When the ShiftDR signal is at a first (i.e., "0") logic level, the input multiplexer 22' passes the signal at its "0" input to a shift flip-flop 24' for receipt at its D input. Conversely, when the ShiftDR signal is at a second logic level (i.e., "1"), the multiplexer 22' passes the signal at its "1" input (i.e., the ScanIN signal) to the D input of the shift flip-flop 24'. Like the shift flip-flop 24 of FIG. 1, the shift flip-flop 24' of FIG. 2 latches the bit received from the input multiplexer 22' so as to supply that bit to an update flip-flop 26' for receipt at its D input. Also, the shift flip-flop 24' supplies its Q output signal (ScanOUT) to a downstream Boundary-Scan cell (not shown), forming that cell's ScanIN signal. As with the update flip-flop 26 of FIG. 1, the update flip-flop 26' of FIG. 2 operates to store the bit previously latched into the shift flip-flop 24'.

The Boundary-Scan cell 12' of FIG. 2 differs from the cell 12 of FIG. 1 because of its lack of any output multiplexer (such as the output multiplexer 28 shown in FIG. 1). Instead, the Boundary-Scan cell 12' includes a system flip-flop 30' having asynchronous clear and preset capability. The system flip-flop 30' has a D input which is supplied directly with the output signal FROMCKT generated by the internal logic block 14 of FIG. 1. As will be appreciated, in this context, the system flip-flop 30' serves to latch the FROMCKT signal in the same way as the system-flip 16 of FIG. 1. To this extent, the system flip-flop 30' performs the same function as the system flip-flop 16. Thus, when the Boundary-Scan cell 12' is implemented with the device 10, the system flip-flop 16 of FIG. 1 becomes redundant and thus is deleted from the internal logic 14 of the device.

The system flip-flop 30' has its Q output coupled to the output buffer 18. Like the system flip-flop 16 of FIG. 1, the system flip-flop 30' of FIG. 2 is clocked in response to the clock signal SYSCLK, typically the same signal clocking the internal logic block 14 of FIG. 1. Unless the system flip-flop 30' has been preset or cleared in the manner discussed below, the flip-flop supplies the output buffer 18 of the device 10 with the bit previously latched from the internal logic block 14 of FIG. 1 during the normal operating mode of the device 10. As will be described, the system flip-flop 30' performs the function of both the system flip-flop 16 of FIG. 1 and the function of the output multiplexer 28 of the Boundary-Scan cell 12 of FIG. 1. Advantageously, the system flip-flop 30' incurs 0-gate propagation delay as compared to the two-gate delay associated with the output multiplexer 28 of FIG. 1.

The system flip-flop 30' has its QN (i.e., its $\overline{Q}$) output coupled to an inverter 31' whose output is coupled to the first (i.e., "0") input of the shift multiplexer 22'. In this way, the shift multiplexer 22' is supplied at its first input with a signal indicative of the delayed FROMCKT signal. It may seem more efficient to simply connect the Q output of the system flip-flop 30' directly to the first input of the shift multiplexer 22', thereby avoiding the need for the inverter 31'. However, there is indeed a good reason for providing the inverter 31'. If the inverter 31' were omitted, and the Q output of the system flip-flop 30' were directly coupled to the first input of the shift multiplexer 22', the performance of the system flip-flop 30' would likely be adversely affected because of the increased loading on its Q output.

The system flip-flop 30' is preset and cleared asynchronously, in accordance with a preset and clear signal, respectively, applied to the flip-flop PD and CDN inputs, respectively, by a logic circuit 32' which is responsive to the MODE signal. In other words, the preset and clear signals which are generated by the logic circuit 32' are capable of either presetting or clearing the system flip-flop 30' without regard to the clock signal SYSCLK.

The logic circuit 32' includes an AND gate 33' for generating the preset signal supplied to the system flip-flop 30' preset input PD in accordance with the MODE signal and with the Q output signal of the update flip-flop 26' which are received at the first and second inputs, respectively, of the AND gate. The logic circuit 32' also includes a NAND gate 34' which generates the clear signal CDN (which is active at a "low" logic level) supplied to the system flip-flop 30' clear input. The NAND gate 34' output signal is generated in accordance with the MODE signal and the QN output signal of the update flip-flop 26', which are supplied to the NAND gate at its first and second inputs, respectively.

When the MODE signal is at a first logic level (i.e., a logic "0"), indicating that the device 10 is to operate in its normal (i.e., non-test mode), the AND gate 33' generates a logic "0" output signal and the NAND gate 34' generates a logic "1" level output signal. Under these conditions, the system flip-flop 30' is not asynchronously cleared or preset. In this way, the system flip-flop 30', when clocked by the clock signal SYSCLK, will output a bit reflecting the state of the delayed FROMCKT signal. However, should both the MODE signal and the Q output of the update flip-flop 26' be at a second logic level (i.e., a logic "1"), then the system flip-flop 30' will be forced to indicate the state of the bit held by the update flip-flop 26'.

When the MODE signal is at a logic "1" level, and the Q and QN output signals of the update flip-flop 26' are at logic "0" and logic "1" levels, respectively, then the AND and the NAND gates 33' and 34', respectively, generate logic "0" and logic "1" level output signals, respectively. Under these conditions then, PD=0 and CDN=0, causing the system flip-flop 30' to be forced cleared. Conversely, when the MODE signal is at a logic "1" level, and the Q and QN output signals of the update flip-flop 26' are at logic "1" and logic "0" levels, respectively, then the AND and NAND gates 33' and 34' generate logic "1" and logic "0" level output signals, respectively. Under these conditions then, PD=1 and CDN=1, causing the system flip-flop 30' to be forced preset. As may now be appreciated, when the MODE signal is at a logic "1" level, the system-flip-flop 30' is asynchronously preset or cleared, depending on the state of the Q and QN output signals of the update flip-flop 26'.

Since the state of the MODE signal influences the preset and clear capability of the system flip-flop 30', it is important that the MODE signal be free of glitches. Even though the MODE signal is typically generated by logic circuitry separate and apart from the boundary scan cell 12', care should be taken in the design of the circuitry generating the MODE signal to avoid such glitches.

As may be appreciated from the foregoing description, the system flip-flop 30' advantageously passes a delayed FROMCKT signal to the output buffer 18 during non-testing intervals with a reduced propagation delay, as compared to the output multiplexer 28 of FIG. 1. This is because during non-testing intervals, the clear and the preset functions of the flip-flop are disabled. However, during testing intervals, the system flip-flop 30' operates to output a bit indicative of the bit latched in the update flip-flop 26', thus effectively passing the bit from the update flip-flop to the output buffer 18' in a fashion similar to the output multiplexer 28 of FIG. 1, but without incurring the propagation delay associated with the multiplexer.

Referring now to FIG. 3, there is shown a block schematic diagram of a preferred embodiment of the system flip-flop 30' which takes the form of a positive clock-edge-triggered D flip-flop. As illustrated in FIG. 3, the system flip-flop 30' includes a first OR gate 36' having a first input, a second input supplied with the preset signal PD, and an output which is coupled to a first input of a NAND gate 38' having a second input coupled with the clear signal CDN. The NAND gate 38' has its output coupled to the input of an inverter 40' whose output is coupled to a first transmission gate 42', the output of which is coupled to the first input of the OR gate 36'. The first input of the OR gate 36' is also coupled to the output of a second transmission gate 44' whose input forms the D input of the system flip-flop 30'.

Each of the transmission gates 42' and 44' is responsive to a pair of control signals supplied to a separate one of a pair of control inputs c and c' on the gate. Only when each of the transmission gates 42' and 44' receives a control signal at a separate one of its c and c' inputs which is at logic "1" and logic "0" levels, respectively, will that gate pass the signal at its input to the first input of the OR gate 36'. Otherwise, no signal passes through the gate. The control inputs c and c' of the gates 42' and 44', respectively, are coupled to the clock input CK of the system flip-flop 36' so as to receive the SYSCLK signal applied thereto. The control inputs c' and c of the transmission gates 42' and 44', respectively, are each supplied with the output of an inverter 46' whose input is coupled to the clock input CK of the system flip-flop 30'. As may be appreciated, when the SYSCLK signal is at a logic "1" level, then the signal from the transmission gate 42' passes to the OR gate 36'. Conversely, when the SYSCLK signal is at a logic "0" level, then the transmission gate 44' is operative to pass the signal at its input to the OR gate 36'.

In addition to being coupled to the input of the inverter 40', the output of the NAND gate 38' is coupled to the input of a transmission gate 48', identical in structure to each of the transmission gates 42' and 44'. Like the transmission gate 42', the transmission gate 48' has its control inputs c and c' supplied with the clock signal SYSCLK and with the output signal of the inverter 46', respectively. The output of the transmission gate 48' is coupled to the input of an inverter 50' whose output forms the Q output of the system flip-flop 30'.

The QN output of the system flip-flop 30' is formed at the output of a NAND gate 52', having its first input supplied with the clear signal CDN and having a second input supplied with the output signal of an OR gate 54'. The OR gate 54' has a first input supplied with the preset signal PD and a second input supplied with the output of the inverter 50'. The output of the NAND gate 52' is supplied to the input of a transmission gate 56' having its c' and c control inputs supplied with the SYSCLK signal and its complement, respectively. The output of the transmission gate 56' is coupled in parallel with the output to the transmission gate 48' so as to be received at the input to the inverter 50'.

As thus described, the QN signal of the system flip-flop 30' is derived from the Q output via the gates 54' and 52'. Deriving the QN signal in this manner allows the QN signal to be complementary to the Q signal but prevents the Q output from suffering any undue loading which might adversely affect the operation of the system flip-flop 30' when the QN output drives a load.

To understand the operation of the system flip-flop 30', consider the state of affairs when the preset signal PD is at a logic "0" level, and the clear signal CDN is at a logic "1" level. Under these conditions, the flip-flop 30' operates as a conventional, positive clock-edge triggered D flip-flop.

When the preset signal PD is at a logic "1" level and the clear signal CDN is at a logic "1" level (indicating a preset condition), then the output signal of the OR gates 36' and 54' both become a logic "1" regardless of the state of the input signal at the D and CK inputs. With the output signal of the OR gates 36' and 54' each at a logic "1" and the clear signal CDN at a logic "1" level, then the NAND gates 38' and 52' each generate a logic "0" output signal. Hence, a logic "1" will now appear at the Q output of the system flip-flop 30' asynchronously, that is, regardless of the logic level of the SYSCLK signal at the CK input of the system flip-flop 30'. This is because if the SYSCLK signal happens to be at a logic "1" level, the output signal of the NAND gate 38' (which is now at a logic "0" level) will pass through the transmission gate 48' to the inverter 50' to cause the Q output of the system flip-flop 30' to be a logic "1" level. Conversely, in the case when the SYSCLK signal is at a logic "0" level, the output signal of the NAND gate 52' (which is now at a logic "0" level) will pass through the transmission gate 56' to the inverter 50' to cause the Q output signal of the system flip-flop 30' to be a logic "1".

When the preset signal PD is at a logic "0" level and the clear signal CDN is at a logic "0" (indicating a clear condition), then the output signal of the NAND gates 38' and 52' will each be at a logic "1" level, regardless of the state of the signals at the D and CK inputs of the system flip-flop 30'. Under these conditions, a logic "0" level signal will appear at the Q output of the system flip-flop 30'. This is because if the SYSCLK signal is at a logic "1" level, the output signal of the NAND gate 38' (which is now at a logic "1" level) will pass through the transmission gate 48' to the inverter 50' to cause the Q output of the system flip-flop 30' to be a logic "0" level. Conversely, in the case when the SYSCLK signal is at a logic "0" level, the output signal of the NAND gate 52' (which is now at a logic "1" level) will pass through the transmission gate 56' to the inverter 50' to cause the Q output signal of the system flip-flop 30' to be a logic "0" level.

The foregoing describes a Boundary-Scan cell 12' which enables Boundary-Scan testing of an electronic device 10, yet incurs reduced propagation for signals passing through the cell during non-testing intervals.

It is to be understood that the above-described embodiments are merely illustrative of the principles of the invention. Various modifications and changes may be made thereto by those skilled in the art which will embody the principles of the invention and fall within the spirit and scope thereof. For example, while the Boundary-Scan cell 12' has been described in the context of being interposed between the internal logic 14 of a device 10 and a corresponding output buffer 18 which drives an output node 20, the cell, with appropriate modifications, may be employed for use with an input node, an input/output node, or a control node.

We claim:

1. A Boundary-Scan cell interposed between an internal logic block of an electronic device and a node of that device, the cell being adapted for serial connection with each of a plurality of Boundary-Scan cells in a single chain for facilitating Boundary-Scan testing during a first interval, comprising:

a shift flip-flop for latching an input bit and generating an output bit in accordance with the latched input bit;

a shift multiplexer having a first input which receives an input bit and a second input which receives a second input bit, the shift multiplexer passing the input bit at a separate one of its first and second inputs to the shift flip-flop in response to an external control bit applied to the multiplexer;

an update flip-flop coupled to the shift flip-flop for latching the bit previously loaded into the shift flip-flop;

a system flip-flop having asynchronous preset and clear capability, the flip-flop having a D input and Q output each coupled to a separate one of the internal logic block of the device and the device node, respectively, a logic circuit coupled to system flip-flop and responsive to both the bit latched in the update flip-flop and to an external MODE bit for forcing the system flip-flop during the first interval to provide a bit at its Q output which corresponds to the bit latched in the update flip-flop and for allowing the system flop-flop to pass a bit appearing at its D input to its Q output during an interval other than during the first interval; and the shift multiplexer being supplied at its first input supplied with an input bit corresponding to the bit appearing at the Q output of the system flip-flop.

2. The apparatus according to claim 1 wherein the logic circuit comprises:

an AND gate having a first input supplied with the MODE bit and a second input supplied with the bit latched in the update flip-flop, the AND gate generating a preset bit supplied to the system flip-flop for presetting the system flip-flop in accordance with the bits at the first and second AND gate inputs; and a NAND gate having a first input supplied with the MODE bit and a second input supplied with a bit complementary to the bit latched in the update flip-flop for generating a clear bit supplied to the system flip-flop for clearing the system flip-flop in accordance with the bits at each of its first and second NAND gate inputs.

3. The apparatus according to claim 1 wherein the system flip-flop has a QN output at which appears a bit complementary to the bit at its Q output and further including an inverter coupled between the QN output of the system flip-flop and the first input of the shift multiplexer.

4. The apparatus according to claim 2 wherein the system flip-flop comprises:

a first transmission gate having an input forming a D input of the system flip-flop, an output, and a pair of control inputs supplied with a clock signal for clocking the system flip-flop and a signal complimentary to the clock signal, respectively, the first transmission gate passing a signal at its input to its output in accordance with a prescribed relationship of the signals present at its control inputs;

a second transmission gate having an input, an output coupled to the output of the first transmission gate, and a pair of control inputs supplied with the clock signal and a signal complimentary to the clock signal, respectively, the second transmission gate passing a signal at its input to its output in accordance with a prescribed relationship of the signals at its control inputs;

a first OR gate having a first input supplied with the preset signal and a second input supplied with the signal appearing at the outputs of the first and second transmission gates, the first OR gate generating an output signal corresponding to a logical ORing of the signals supplied to its inputs;

a first NAND gate having a first input supplied with the output signal of the first OR gate and a second input supplied with the clear signal, the first NAND gate generating an output signal corresponding to a logical NANDing of the signals at its inputs;

an inverter having an input supplied with the output signal of the first NAND gate and an output coupled to the input of the second transmission gate for supplying the second transmission gate with a signal at its input which is complementary to the output signal of the first NAND gate;

a third transmission gate having an input coupled to the output of the first NAND gate, an output, and a pair of control inputs, supplied with the clock signal and a signal complimentary to the clock signal, respectively, the third transmission gate passing the signal at its input to its output in accordance with a prescribed relationship of the signals at its control inputs;

a fourth transmission gate having an input, an output coupled to the output of the third transmission gate and a pair of control inputs supplied with the clock signal and the signal complimentary to the clock signal, respectively, the fourth transmission gate passing the signal at its input to its output in accordance with a prescribed relationship of the signals its control inputs;

a second inverter having an input coupled to the outputs of the third and fourth transmission gates and an output forming the Q output of the system flip-flop, the second inverter inverting the signal at the outputs of the third and fourth transmission gates;

a second OR gate having a first input coupled to the output of the second inverter and a second input supplied with the present signal, the second OR gate for generating an output signal corresponding to a logical ORing of the signals at its first and second inputs; and a second NAND gate having a first input supplied with the output signal of the second OR gate, a second input supplied with the clear signal and an output forming a QN output for the system flip-flop and coupled to the input of the fourth transmission gate, the second NAND gate generating an output signal corresponding to a logical NANDing of the signals at its first and second inputs.

5. A method for controlling the passage of signals between an internal logic block of an electronic device and a device node so that during non-testing intervals a bit normally present at a separate one of the internal logic block and the device node passes therebetween, while during a testing mode, an update bit is passed between the internal logic block and the device node, comprising the steps of:

latching the update bit in an update flip-flop;

operating a system flip-flop, having asynchronous preset and clear capability, such that the flip-flop has its preset and clear capability disabled during non-testing intervals so that the flip-flop passes the normally present bit between the internal logic block and the device mode; and applying a prescribed combination of preset and flip-flop signals during test intervals to force the flip-flop to pass a bit corresponding to the latched update bit between the internal logic block of the device and the device node.

* * * * *